US009525068B1

(12) United States Patent
Gupta et al.

(10) Patent No.: US 9,525,068 B1
(45) Date of Patent: Dec. 20, 2016

(54) VARIABLE GATE WIDTH FINFET

(71) Applicant: Altera Corporation, San Jose, CA (US)

(72) Inventors: Mayank Kumar Gupta, Santa Clara, CA (US); Peter Smeys, San Jose, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 13/833,180

(22) Filed: Mar. 15, 2013

(51) Int. Cl.
*H01L 29/66* (2006.01)
*H01L 29/78* (2006.01)
*H01L 21/8234* (2006.01)
*H01L 21/8238* (2006.01)

(52) U.S. Cl.
CPC ..... *H01L 29/785* (2013.01); *H01L 21/823431* (2013.01); *H01L 21/823821* (2013.01); *H01L 29/66795* (2013.01)

(58) Field of Classification Search
CPC ............... H01L 21/823431; H01L 21/823821; H01L 29/785
See application file for complete search history.

(56) References Cited

U.S. PATENT DOCUMENTS

| 7,612,405 | B2 | 11/2009 | Yu et al. | |
|---|---|---|---|---|
| 2004/0036127 | A1* | 2/2004 | Chau et al. | 257/401 |
| 2005/0282345 | A1* | 12/2005 | Mathew et al. | 438/301 |
| 2008/0128797 | A1 | 6/2008 | Dyer et al. | |
| 2011/0193178 | A1* | 8/2011 | Chang et al. | 257/408 |
| 2013/0230953 | A1* | 9/2013 | Sudo | 438/268 |
| 2014/0035066 | A1* | 2/2014 | Tsai et al. | 257/401 |

* cited by examiner

*Primary Examiner* — Peniel M Gumedzoe

(57) ABSTRACT

An improved FinFET has a gate structure on only a portion of the available surface on a fin, thereby providing a FinFET with a finer granularity width dimension. To form the FinFET, a first etch-resistant sacrificial layer and a second etch-resistant spacer layer are formed on the fin. The spacer layer is etched anisotropically to remove the spacer layer from the top and upper sidewalls of the fin while leaving the spacer layer on the lower sidewalls of the FinFET. A gate dielectric and conducting layer are then deposited and shaped to form a structure that is effective as a gate only on the top and upper sidewalls of the fin.

9 Claims, 3 Drawing Sheets

VARIABLE GATE WIDTH FINFET

BACKGROUND

This relates to semiconductor devices such as FinFETs (Fin Field Effect Transistors).

A conventional field effect transistor (FET) is an essentially planar device having a gate structure that extends across the surface of a semiconductor such as monocrystalline silicon and doped source and drain regions in the semiconductor on either side of the gate. The gate is insulated from the semiconductor by a thin layer of an insulator such as silicon oxide. A voltage applied to the gate controls current flow in an un-doped channel that extends between the doped source and drain regions in the semiconductor beneath the gate.

The switching speed of the FET depends on the amount of current flow between the source and drain regions. Current flow depends on the width of the gate where width is the direction in the channel that is perpendicular to the direction of current flow. With the continuing demand for higher speed transistors for use in communication and computer equipment, there is a continuing interest in making transistor devices with wider gates.

FinFETs have been developed to obtain larger gate widths A fin is a thin segment of semiconductor material standing on edge, thereby making available multiple surfaces for the formation of gate structures. FIG. 1 depicts an illustrative FinFET 100 comprising four fins 110, 120, 130, 140 and a common gate structure 150. The fins have first and second major surfaces, such as surfaces 112, 114, that are opposite one another and usually are symmetric about a center plane that bisects the fin lengthwise. Major surfaces 112, 114 are often illustrated as being parallel as in U.S. Pat. No. 7,612,405 B2 or Pub. No. US2008/0128797 A1, which are incorporated herein by reference; but process limitations usually result in surfaces that slope outwardly from top to bottom of the fin with the result that the cross-section of the fin is trapezoidal in shape. In some cases, sidewalls 112, 114 meet at the top. FinFET 100 has a common gate structure. In other embodiments, a separate gate structure may be located on each surface of each fin. The width of the gate structure 150 shown in FIG. 1 can be as much as N(T+2H) where N is the number of fins, T is the distance, if any, between the first and second major surfaces of the fin and H is the height of the fin.

Doped source and drain regions are located on opposite sides of the gates. As in a planar FET, a voltage applied to the gate controls current flow in an un-doped channel that extends between the doped source and drain regions in the semiconductor beneath the gate.

While FinFETs make possible the formation of transistor structures of considerable width, the process of forming FinFETs limits the number of different gate widths that can readily be formed. Since fins are typically formed by etching parallel channels into a semiconductor material from a flat surface and since the etching rate is the same for each channel, the height of each fin that is formed is approximately the same. As a result, readily achievable gate widths are available only in discrete steps. For optimal device sizing, however, there is a need for finer granularity in available gate widths. Efforts to provide such variations in widths as described in the above-referenced U.S. Pat. No. 7,612,405 B2 or Pub. No. US2008/0128797 A1 are complicated and introduce too many additional steps into the fabrication process.

SUMMARY

The present invention relates to an improved FinFET having fine granularity gate width and a process that facilitates the formation of such FinFET.

The improved FinFET has a gate structure on only a portion of its available surface on a fin, thereby providing a FinFET with a finer granularity width dimension. To form the FinFET, a sacrificial layer and a spacer layer are formed on the fin with the spacer layer covering the sacrificial layer. The spacer layer is then etched anisotropically to remove the spacer layer from the top and upper sidewalls of the fin while leaving the spacer layer on the lower sidewalls of the fin. A gate dielectric and conducting layer are then deposited and shaped to form a structure that is effective as a gate only on the top and upper sidewalls of the fin.

Advantageously, gate structures that extend over the entire sidewalls of selected fins can be formed in the same process as that for forming gate structures of reduced width. After completion of the anisotropic etch, the fins that are to have a reduced width are covered with a suitable etch-resistant photoresist using known photolithographic processes. An isotropic etch is then performed to remove the portion of the second spacer layer that remains on the lower sidewalls of the fins that are not covered by the photoresist. Finally, the photoresisist is removed leaving a structure in which some fins have their lower sidewalls covered by the second spacer layer and other fins do not. A gate structure may then be formed on the fins by replacing the first layer on the exposed surfaces with a suitable dielectric, forming a conducting layer on the dielectric layer, and removing portions of the conducting layer and the dielectric layer to produce the final desired shape of the gate structure.

Numerous variations may be practiced in the foregoing embodiment.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
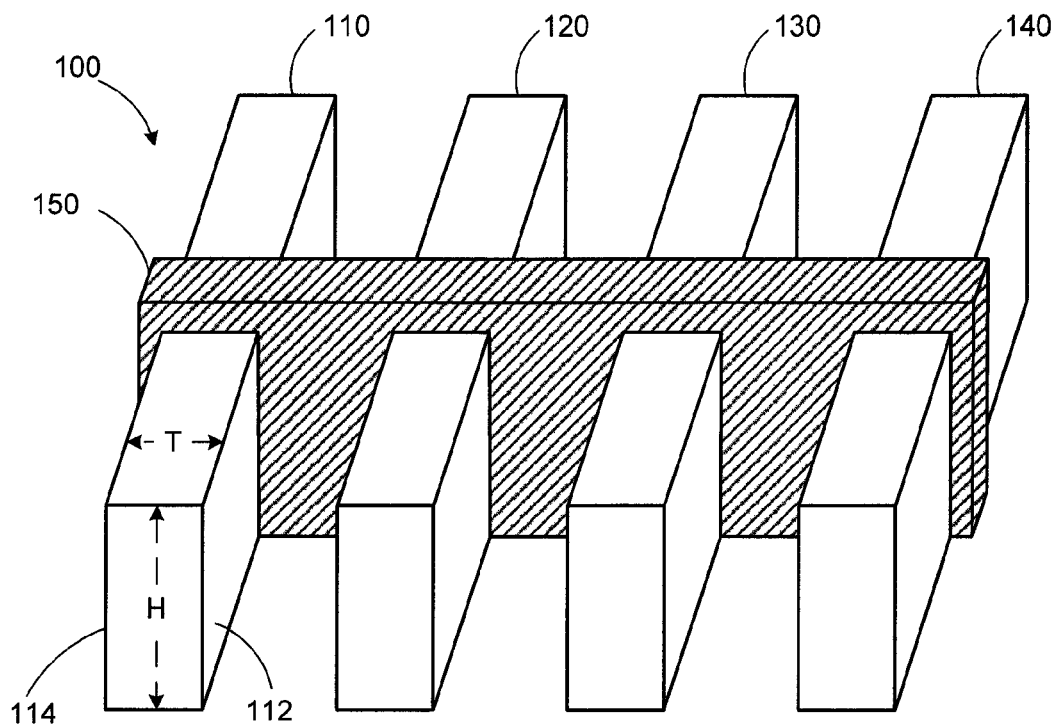
FIG. 1 is a perspective view of a prior art FinFET.
Figure 2:
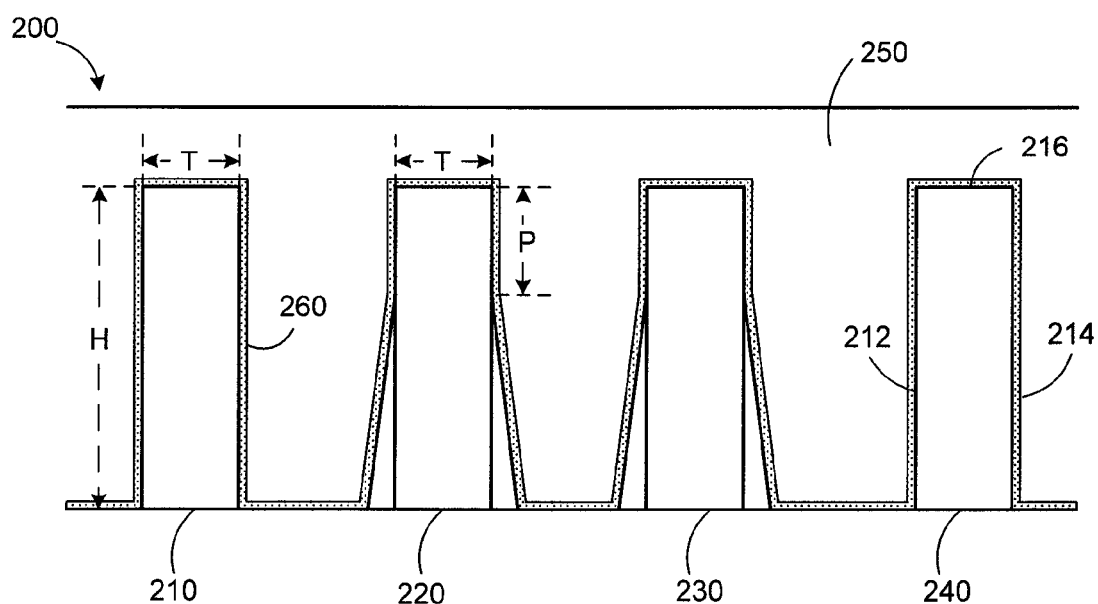
FIG. 2 is a cross-sectional view of an illustrative embodiment of the invention.

FIG. 2 is a cross-sectional view of an illustrative FinFET 200 of the invention. FinFET 200 comprises four fins 210, 220, 230, 240 and a common gate structure 250 on a dielectric layer 260. Each fin has first and second major surfaces or sidewalls 212, 214, that are opposite one another and typically are symmetric about a center plane that bisects the fin lengthwise. Each fin may also have a top surface 216 that extends between the upper edges of major surfaces 212, 214. The major surfaces are illustrated as being parallel but it will be understood that because of process limitations these surfaces usually slope outwardly from top to bottom of each fin with the result that the cross-section of the fin is trapezoidal in shape. In some cases, sidewalls 212, 214 meet at the top and there is no top surface 216 at all.

In the case of fins 210 and 240, the gate structure extends the distance T, if any, across the top surface and the full distance H from top to bottom on the two major surfaces of the fin. In the case of fins 220 and 230, the gate structure extends the distance T, if any, across the top surface and the distance P across the top portion of each sidewall of the fin.

FinFET 200 is only illustrative of the number and types of fins that may be used in the practice of the invention. As few as one fin 220 may be used. And as many fins 210, 220 may be used as needed to obtain the desired gate width and granularity.

Figure 3:
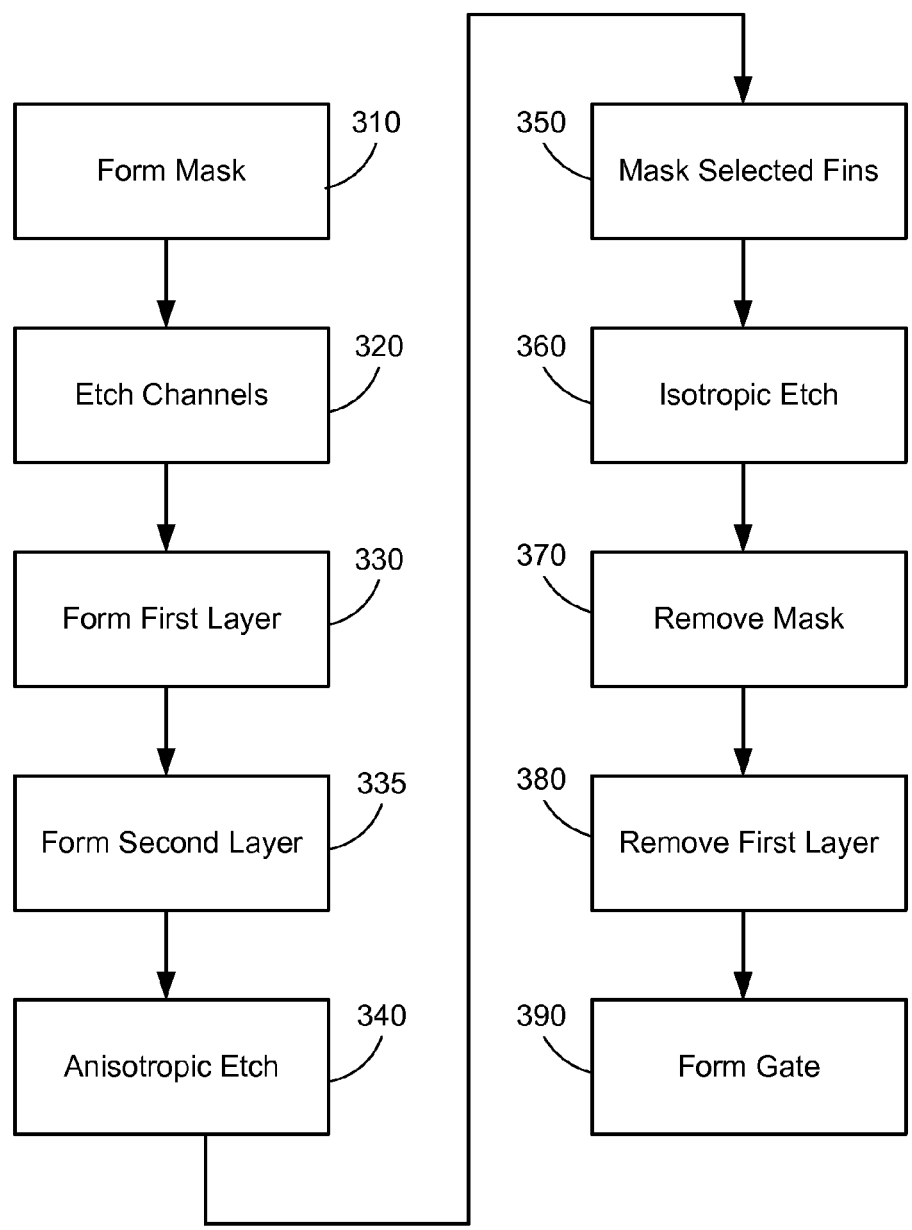
FIG. 3 is a flowchart depicting an illustrative embodiment of the invention.

FIG. 3 is a flow chart depicting the process for forming FinFET 200. The process is performed on a wafer of semiconductor material such as monocrystalline silicon that may be up to 12 inches (300 mm.) in diameter in today's state-of-the-art processes. Typically, numerous such Fin-FETs 200 are formed simultaneously. FIGS. 4A-4F depict illustrative cross-sections of FinFET 200 at certain steps in the process of FIG. 3

Figure 4A:
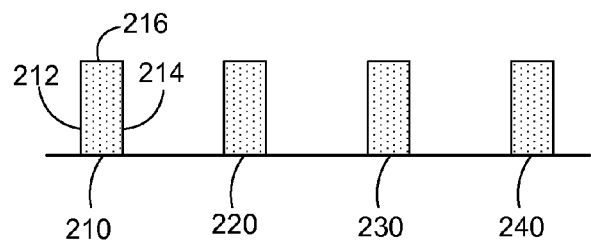
FIGS. 4A-4F are cross-sections depicting certain steps of FIG. 3.

At step 310 of FIG. 3, a mask pattern is formed on a surface of the silicon using well-known photolithographic techniques. The mask pattern defines at least five parallel channels and, typically, many more to be formed in the silicon. At step 320, the mask pattern is used to control the etching of parallel channels in the silicon using known etching technology. As a result of step 320, at least four fins and, typically, many more are formed in the silicon, the fins having first and second major surfaces 212, 214 and possibly a top surface 216 that extends between the upper edges of the first and second major surfaces. FIG. 4A is a cross-section of FinFET 400 after completion of step 320.

Figure 4B:
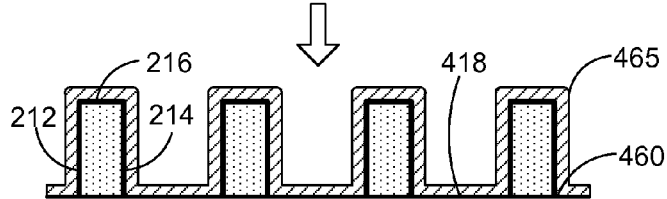

At step 330 a first etch-resistant sacrificial layer 460 is formed on first and second major surfaces 212, 214 and top surface 216 of each fin as well as on the surface 418 at the bottom of each channel. Illustratively, the sacrificial layer may be silicon oxide. At step 335, a second etch-resistant spacer layer 465 is formed on layer 460. Illustratively, this layer may be silicon nitride or some other dielectric having selectivity over first etch-resistant layer 460. FIG. 4B is a cross-section of FinFET 400 after completion of step 335.

Figure 4C:
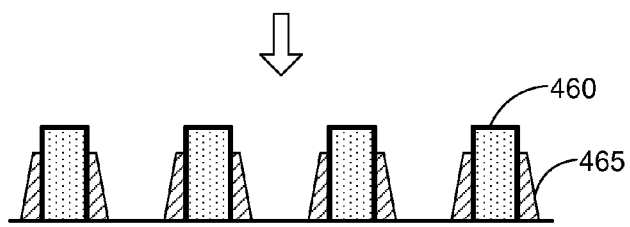

At step 340, an anisotropic etch is performed that selectively removes portions of selective layer 465. In particular, the etch preferentially removes the portions of second layer 465 that are on horizontal surfaces and the upper sidewalls of the fins down to the underlying first layer 460 but does not remove significant portions of first layer 460 and does not remove significant portions of second spacer layer 465 on the lower sidewalls of the fins. As a result, each fin has lower sidewalls that remain covered by second spacer layer 465 and a top surface and upper sidewalls where first layer 460 is exposed. Illustratively, the anisotropic etch is a dry reactive ion etch. FIG. 4C is a cross-section of FinFET 200 after completion of step 340.

A gate structure of reduced width can then be formed by replacing the exposed portion of the first layer with a suitable dielectric layer and a conducting layer and shaping the dielectric layer and the conducting layer to form a gate. Then, by combining gate structures formed on the top surfaces and upper sidewalls of a selected number of fins with gate structures formed on the top surfaces and full sidewalls of other fins, gate structures can be formed having any desired width and much finer granularity.

Figure 4D:
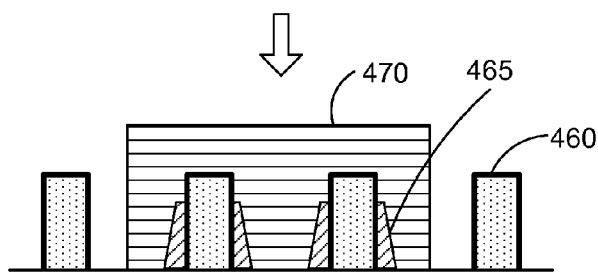

Advantageously, gate structures that extend over the entire sidewalls of selected fins can be formed in the same process as that for forming gate structures of reduced width. After completion of the anisotropic etch, the fins that are to have a reduced width are covered at step 350 with a suitable etch-resistant photoresist 470 using known photolithographic processes; and an isotropic etch is performed at step 360 to remove the remaining portions of second layer 465 from the fins where the gate structure is to extend over the entire sidewall of the fin. Illustratively, the isotropic etch is a wet etch. FIG. 4D is a cross-section of FinFET 200 after completion of step 360.

Figure 4E:
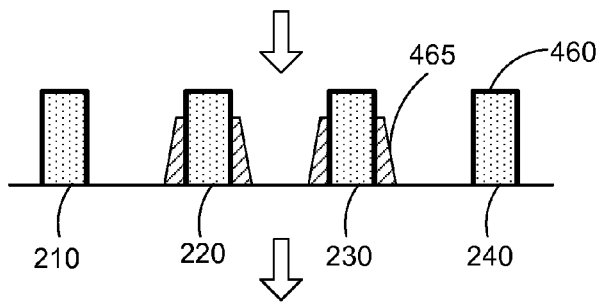

At step 370, the photoresist is removed from the remaining fins leaving a structure in which some fins 220, 230 have their lower sidewalls covered by second spacer layer 465 and other fins 210, 240 do not. FIG. 4E is a cross-section of FinFET 200 after completion of step 380.

Figure 4F:
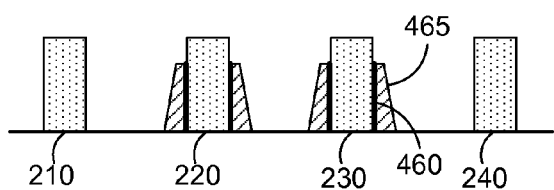

A gate structure may then be formed by removing first layer 460 at step 380 and replacing it on the exposed surfaces with a suitable dielectric, forming a conducting layer on the dielectric layer, and removing portions of the conducting layer and the dielectric layer to produce at step 390 the final desired shape of the gate structure. FIG. 4F is a cross-section of FinFET 200 after completion of step 380; and FIG. 2 is a cross-section of FinFET 200 after completion of step 390.

As will be apparent to those skilled in the art, numerous variations may be practiced within the spirit and scope of the present invention. For example, while the invention has been described for a FinFET made of silicon, numerous other semiconductor materials may also be used in the practice of the invention such as germanium, gallium arsenide and other III-V compounds. While one process has been described for the formation of FinFET 200, other processes may also be used; and numerous variations in these processes may also be practiced. While an illustrative first etch resistant layer has been identified as silicon oxide and a second etch-resistant layer has been identified as silicon nitride, many other material combinations may be used for the two layers provided the second layer is selectively etched in the anisotropic etch. Likewise, a variety of different etching processes may be used as is known in the art.

What is claimed is:

1. A FinFET comprising:
   at least a first thin segment of a semiconductor material having first and second opposing major surfaces extending from top to bottom of the first thin segment;
   first and second spacer layers that extend to the bottom of the first thin segment on a lower portion of the first and second opposing major surfaces, respectively, of the first thin segment;
   a second thin segment of a semiconductor material having first and second opposing major surfaces extending from top to bottom of the second thin segment;
   a dielectric layer on the first and second spacer layers and upper portions of the first and second opposing major surfaces of the first thin segment and extending from top to bottom on the first and second opposing major surfaces of the second thin segment, and wherein the dielectric layer directly contacts vertical portions of the first and second opposing major surfaces of the second thin segment; and
   a conducting layer on the dielectric layer.

2. The FinFET of claim 1 wherein the semiconductor material is silicon.

3. The FinFET of claim 1 wherein the first thin segment has a top surface extending between upper edges of the first and second opposing major surfaces.

4. The FinFET of claim 1 wherein the spacer layers are silicon nitride.

5. The FinFet of claim 1 wherein there are a plurality of first thin segments extending in a first direction with a channel between adjacent first thin segments.

6. A FinFET comprising:
a plurality of first thin segments of a semiconductor material, each first thin segment extending in a first direction with a channel between adjacent first thin segments;
first and second spacer layers on a lower portion of first and second major surfaces, respectively, of each first thin segment and extending to a bottom of each first thin segment;
at least a second thin segment of a semiconductor material, extending in the first direction and separated from an adjacent first thin segment by a channel;
a dielectric layer on the first and second spacer layers and upper portions of the first and second major surfaces of each first thin segment and extending from top to bottom on first and second major surfaces of the second thin segment, and wherein the dielectric layer directly contacts vertical portions of the first and second major surfaces of the second thin segment; and
a conducting gate extending across the first thin segments and the second thin segment on the dielectric layer.

7. The FinFET of claim 6 wherein the semiconductor material is silicon.

8. The FinFET of claim 6 wherein the spacer layers are silicon nitride.

9. The FinFET of claim 6 wherein each of the first thin segments has a top surface extending between upper edges of the first and second major surfaces.

* * * * *